(12) United States Patent
Ho et al.

(10) Patent No.: US 10,323,996 B2
(45) Date of Patent: Jun. 18, 2019

(54) PRESSURE SENSOR AND MANUFACTURING METHOD THEREOF

(71) Applicant: Winbond Electronics Corp., Taichung (TW)

(72) Inventors: Yu-Hsuan Ho, Taichung (TW); Ming-Chih Tsai, Taichung (TW); Ming-Hung Hsieh, Taichung (TW)

(73) Assignee: Winbond Electronics Corp., Taichung (TW)

( * ) Notice: Subject to any disclaimer, the term of this patent is extended or adjusted under 35 U.S.C. 154(b) by 178 days.

(21) Appl. No.: 15/669,972

(22) Filed: Aug. 7, 2017

(65) Prior Publication Data

US 2018/0209864 A1  Jul. 26, 2018

(30) Foreign Application Priority Data

Jan. 23, 2017  (CN) .......................... 2017 1 0058129

(51) Int. Cl.
| | | |
|---|---|---|
| *G01L 9/10* | (2006.01) | |
| *H01L 29/786* | (2006.01) | |
| *H01L 27/102* | (2006.01) | |
| *C01B 13/00* | (2006.01) | |
| *H01L 29/06* | (2006.01) | |

(52) U.S. Cl.
CPC ................ *G01L 9/10* (2013.01); *C01B 13/00* (2013.01); *H01L 27/1024* (2013.01); *H01L 29/0669* (2013.01); *H01L 29/0673* (2013.01); *H01L 29/786* (2013.01)

(58) Field of Classification Search
CPC ........... C01B 13/00; G01L 9/10; H01L 27/10; H01L 27/1024; H01L 29/0669; H01L 29/0673; H01L 29/786
See application file for complete search history.

(56) References Cited

U.S. PATENT DOCUMENTS

| | | | |
|---|---|---|---|
| 2012/0256838 A1 | 10/2012 | Lee et al. | |
| 2013/0106244 A1* | 5/2013 | Liu | ..................... H01L 41/1132 310/338 |
| 2017/0284883 A1* | 10/2017 | Yang | ..................... G01L 9/0072 |

FOREIGN PATENT DOCUMENTS

| | | | |
|---|---|---|---|
| CN | 101397121 | 4/2009 | |
| CN | 103155174 | 6/2013 | |
| CN | 104220964 | 12/2014 | |
| CN | 105021329 | 11/2015 | |
| CN | 105607790 | 5/2016 | |
| JP | 2018128266 A | * 8/2018 | ........... H01L 29/786 |
| TW | 200717750 | 5/2007 | |

(Continued)

OTHER PUBLICATIONS

"Office Action of Taiwan Counterpart Application," dated Jun. 11, 2018, pp. 1-5.

*Primary Examiner* — Nguyen Q. Ha

(74) *Attorney, Agent, or Firm* — JCIPRNET

(57) ABSTRACT

A pressure sensor and a manufacturing method thereof are provided. The pressure sensor includes a thin-film transistor (TFT) array and a pressure-sensitive layer covering the TFT array. The pressure-sensitive layer includes a plurality of insulating layers and one of one-directional materials arranged on the same plane and two-directional materials. The insulating layers and the one- or two-directional materials are alternately stacked so as to effectively enhance pressure resolution.

15 Claims, 3 Drawing Sheets

(56) References Cited

FOREIGN PATENT DOCUMENTS

TW 201203382 1/2012
TW I557626 11/2016

* cited by examiner

PRESSURE SENSOR AND MANUFACTURING METHOD THEREOF

CROSS-REFERENCE TO RELATED APPLICATION

This application claims the priority benefits of China application serial no. 201710058129.1, filed on Jan. 23, 2017. The entirety of the above-mentioned patent application is hereby incorporated by reference herein and made a part of this specification.

BACKGROUND OF THE INVENTION

Field of the Invention

The invention relates to a pressure sensing technique, and more particularly, to a pressure sensor and a manufacturing method thereof.

Description of Related Art

In recent, the pressure-sensitive layer in the pressure sensor is mostly formed by mixing conductive particles in a resin. The pressure-sensitive layer is functioned by pressure resulting in thinning thickness thereof so as to reduce output resistance. However, since the conductivity of conductive particles lacks directionality, not only does resistance change occur to regions subjected to pressure, regions not subjected to pressure are also readily affected, such that pressure resolution is worsened. Therefore, how to alleviate the above issues of the pressure sensor to achieve excellent resolution is an important research topic.

SUMMARY OF THE INVENTION

The invention provides a pressure sensor that can effectively enhance pressure resolution.

The invention further provides a pressure sensor that can also effectively enhance pressure resolution.

The invention further provides a manufacturing method of a pressure sensor that can manufacture a pressure sensor having high pressure resolution. A pressure sensor of the invention includes a thin-film transistor array and a pressure-sensitive layer covering the thin-film transistor array. In particular, the pressure-sensitive layer includes a plurality of one-directional materials arranged on the same plane and a plurality of insulating layers, and the one-directional materials and the insulating layers are alternately stacked.

Another pressure sensor of the invention includes a thin-film transistor array and a pressure-sensitive layer covering the thin-film transistor array. In particular, the pressure-sensitive layer includes a plurality of two-directional materials and a plurality of insulating layers, and the two-directional materials and the insulating layers are alternately stacked.

In the above embodiments of the invention, the pressure-sensitive layer may be inductive resistive.

In an embodiment of the invention, the diameter of the one-directional material may be 5 nm to 100 nm.

In an embodiment of the invention, the aspect ratio of the one-directional material may be greater than 100.

In an embodiment of the invention, the one-directional material may include a metal nanowire, a carbon nanotube, or a metal oxide semiconductor.

In an embodiment of the invention, a metal of the metal nanowire may include gold, silver, or copper.

In an embodiment of the invention, a metal oxide of the metal oxide semiconductor may include zinc oxide, titanium oxide, tungsten oxide, molybdenum oxide, vanadium oxide, copper oxide, nickel oxide, cobalt oxide, iron oxide, or tin oxide.

In another embodiment of the invention, the two-directional material may include graphene oxide or molybdenum disulfide.

A manufacturing method of the pressure sensor of the invention includes forming a thin-film transistor array and forming a pressure-sensitive layer on the thin-film transistor array by 3D printing. The pressure-sensitive layer includes a plurality of insulating layers and a plurality of one-directional materials arranged on the same plane that are alternately stacked, or the pressure-sensitive layer includes a plurality of insulating layers and a plurality of two-directional materials that are alternately stacked.

Based on the above, in the pressure sensor of the invention, by disposing alternately stacked insulating layers and one- or two-directional materials arranged on the same plane in the pressure-sensitive layer, the conductive structure in the pressure-sensitive layer may be a conductive layer having directionality, and therefore the pressure resolution of the pressure sensor is enhanced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
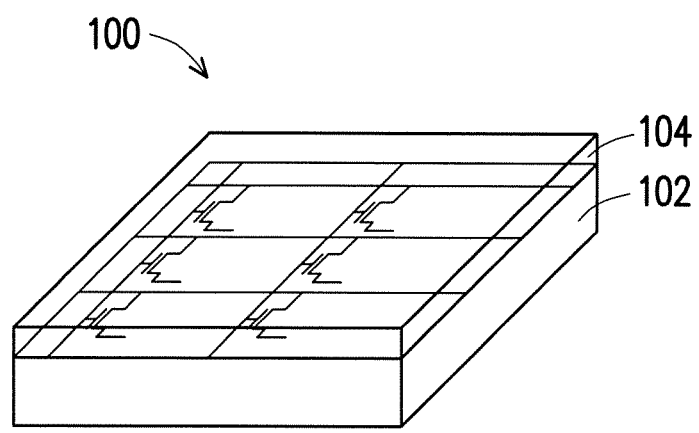
FIG. 1 is a three-dimensional schematic diagram of a pressure sensor according to an embodiment of the invention.

FIG. 1 is a three-dimensional schematic diagram of a pressure sensor according to an embodiment of the invention.

Please refer to FIG. 1. A pressure sensor 100 of the present embodiment includes a thin-film transistor array 102 and a pressure-sensitive layer 104 covering the thin-film transistor array 102. The pressure-sensitive layer 104 is, for instance, inductive resistive.

Hereinafter, the detailed structure of the pressure sensor of FIG. 1 and embodiments thereof are exemplarily described with reference to FIG. 2A and FIG. 2B.

Figure 2A:
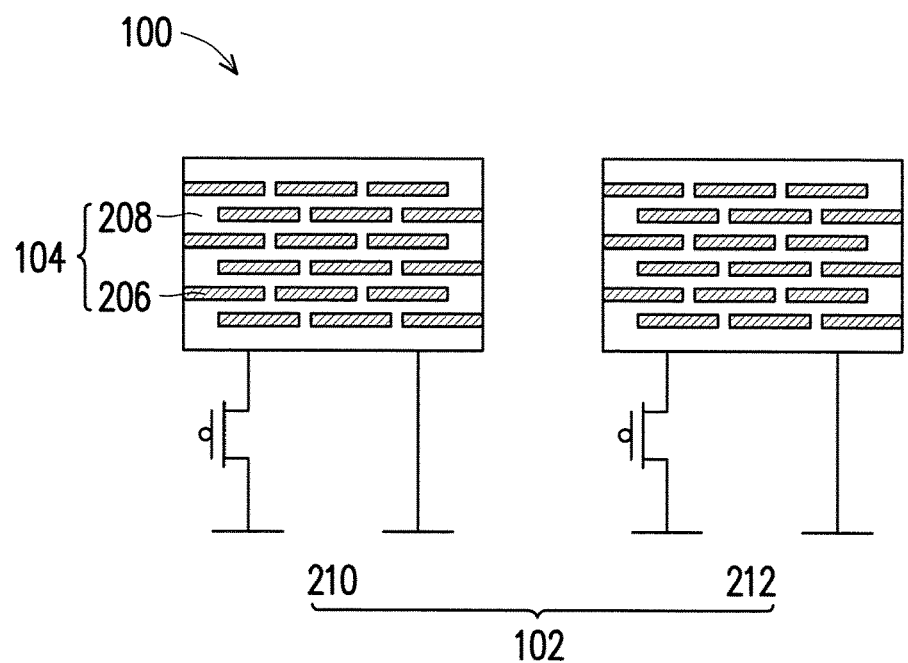
FIG. 2A is a cross-sectional schematic diagram of the pressure sensor of FIG. 1 not under pressure.

Please refer first to FIG. 2A. The pressure sensor 100 of the present embodiment includes a thin-film transistor array 102 and a pressure-sensitive layer 104 covering the thin-film transistor array 102. The pressure-sensitive layer 104 includes a plurality of one-directional materials 206 arranged on the same plane and a plurality of insulating layers 208, and the one-directional materials 206 and the insulating layers 208 are alternately stacked, such that the one-directional materials 206 between the layers are not in contact with one another.

In the present embodiment, the diameter of the one-directional material is generally 5 nm to 100 nm, preferably 20 nm to 80 nm, and more preferably 40 nm to 60 nm. Moreover, in terms of good conductivity, the length of the one-directional material is not particularly limited provided the aspect ratio of the one-directional material is greater than 100. For instance, the one-directional material may include a metal nanowire, a carbon nanotube, or a metal oxide semiconductor. The metal of the metal nanowire may include gold, silver, or copper, but is not limited thereto. The metal oxide of the metal oxide semiconductor may include zinc oxide, titanium oxide, tungsten oxide, molybdenum oxide, vanadium oxide, copper oxide, nickel oxide, cobalt oxide, iron oxide, or tin oxide, but is not limited thereto.

Figure 2B:
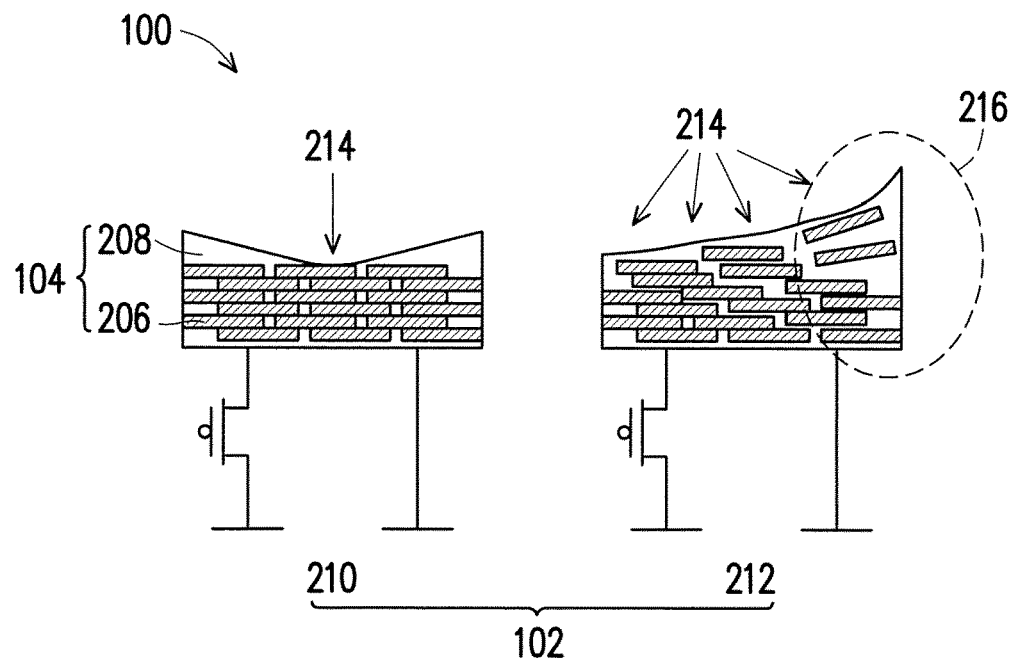
FIG. 2B is a cross-sectional schematic diagram of the pressure sensor of FIG. 2A under pressure.

In FIG. 2A and FIG. 2B, for ease of illustration, only two adjacent thin-film transistor elements (a first thin-film transistor element 210 and a second thin-film transistor element 212) are shown, but it should be understood that, the thin-film transistor array may contain more thin-film transistor elements and is not limited to the quantity shown in FIG. 2A or FIG. 2B.

When pressure is not applied, as shown in FIG. 2A, since the one-directional materials 206 on the first thin-film transistor element 210 and the second thin-film transistor element 212 are separated by the insulating layers 208, current is not readily transferred between the one-directional materials 206, and therefore the pressure-sensitive layer 104 is in high-resistance state. When a pressure 214 is applied to a region of the first thin-film transistor element 210, as shown in FIG. 2B, the distances between the one-directional materials 206 are decreased due to the deformation of the pressure-sensitive layer 104 on the first thin-film transistor element 210 from pressure. As a result, current is readily transferred between the one-directional materials 206, such that the resistance of the pressure-sensitive layer 104 is reduced. Moreover, although the pressure-sensitive layer 104 on the second thin-film transistor element 212 is also deformed due to the pressure 214, even if deformation occurs, the one-directional materials 206 having directionality do not readily come in contact with one another since the pressure-sensitive layer 104 is not directly located on the point of application. Therefore, in the pressure-sensitive layer 104, the region 216 away from the point of application still has high resistance. Therefore, in comparison to conventional pressure sensor in which the pressure-sensitive layer contains conductive particles, the invention may provide better pressure resolution and may be applied in a pressure image sensing technique such as fingerprint recognition or foot pressure sensing, but is not limited thereto. The invention may be applied in any situation requiring pressure sensing.

Moreover, the one-directional materials 206 may also be replaced by two-directional materials (not shown) such that a pressure-sensitive layer is formed by the alternate stacking of the two-directional materials and the insulating layers 208. The two-directional materials may include, for instance, graphene oxide or molybdenum disulfide (MoS2), but is not limited thereto. The structure of the two-directional materials may also be alternately stacked with the insulating layers 208 to prevent contact of the two-directional materials between the layers. Therefore, the embodiment thereof is similar to that of the one-directional materials and is therefore not repeated herein.

Figure 3:
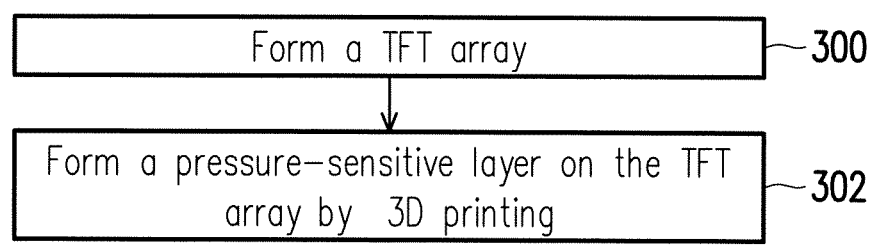
FIG. 3 is a manufacturing flow chart of a pressure sensor according to another embodiment of the invention.

Hereinafter, the manufacturing method of the pressure sensor according to another embodiment of the invention is described. Please refer to FIG. 3.

First, step 300 is performed to form a TFT (thin-film transistor) array, and the method of forming the TFT array may adopt any known manufacturing method.

Then, step 302 is performed to form a pressure-sensitive layer on the TFT array by 3D printing, wherein the pressure-sensitive layer includes insulating layers and one-directional materials arranged on the same plane, and the insulating layers and the one-directional materials are alternately stacked. In other embodiment, the pressure-sensitive layer includes insulating layers and two-directional materials, and the insulating layers and the two-directional materials are alternately stacked. The one-directional materials and the two-directional materials are as described in each of the embodiments above and are therefore not repeated herein. When the pressure-sensitive layer is a one-directional material, the insulating layers and the one-directional materials are alternately formed on the TFT array, and therefore the one-directional materials between the layers do not come in contact in the absence of pressure, and current is transferred between the one-directional materials only after the pressure-sensitive layer is subjected to a certain amount of pressure to change (reduce) the resistance of the pressure sensor.

When the pressure-sensitive layer includes two-directional materials, the insulating layers and the two-directional materials are similarly alternately formed on the TFT array, and the results thereof are the same as those of the pressure-sensitive layer formed by one-directional materials.

Moreover, in addition to the 3D printing, the method of forming the pressure-sensitive layer may also adopt a manufacturing method suitable for roll-to-roll such as screen printing or gravure printing.

Based on the above, in the pressure sensor of the invention, by alternately stacking the plurality of one-directional materials arranged on the same plane and the insulating layers or alternately stacking the plurality of two-directional materials and the insulating layers in the pressure-sensitive layer, the pressure resolution of the pressure sensor may be enhanced. The reason is that, current transfer between the one-directional materials or two-directional materials has directionality, and therefore in comparison to conventional pressure sensor in which the pressure-sensitive layer contains conductive particles, the invention may provide better pressure resolution.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A pressure sensor, comprising:
a thin-film transistor array; and
a pressure-sensitive layer covering the thin-film transistor array, wherein the pres sure-sensitive layer comprises a plurality of one-directional materials arranged on the same plane and a plurality of insulating layers, and wherein the one-directional materials and the insulating layers are alternately stacked.

2. The pressure sensor of claim 1, wherein the pressure-sensitive layer is inductive resistive.

3. The pressure sensor of claim 1, wherein a diameter of the one-directional material is 5 nm to 100 nm.

4. The pressure sensor of claim 1, wherein an aspect ratio of the one-directional material is greater than 100.

5. The pressure sensor of claim 1, wherein the one-directional material comprises a metal nanowire, a carbon nanotube, or a metal oxide semiconductor.

6. The pressure sensor of claim 5, wherein a metal of the metal nanowire comprises gold, silver, or copper.

7. The pressure sensor of claim 5, wherein a metal oxide of the metal oxide semiconductor comprises zinc oxide, titanium oxide, tungsten oxide, molybdenum oxide, vanadium oxide, copper oxide, nickel oxide, cobalt oxide, iron oxide, or tin oxide.

8. A pressure sensor, comprising:
a thin-film transistor array; and
a pressure-sensitive layer covering the thin-film transistor array, wherein the pressure-sensitive layer comprises a plurality of two-directional materials and a plurality of insulating layers, and wherein the two-directional materials and the insulating layers are alternately stacked.

9. The pressure sensor of claim 8, wherein the two-directional material comprises graphene oxide or molybdenum disulfide.

10. The pressure sensor of claim 8, wherein the pressure-sensitive layer is inductive resistive.

11. A manufacturing method of a pressure sensor, comprising:
forming a thin-film transistor array; and
forming a pressure-sensitive layer on the thin-film transistor array by 3D printing, wherein the pressure-sensitive layer comprises a plurality of insulating layers and a plurality of one-directional materials arranged on the same plane that are alternately stacked, or the pressure-sensitive layer comprises the plurality of insulating layers and a plurality of two-directional materials that are alternately stacked.

12. The manufacturing method of the pressure sensor of claim 11, wherein a diameter of the one-directional material is 5 nm to 100 nm.

13. The manufacturing method of the pressure sensor of claim 11, wherein an aspect ratio of the one-directional material is greater than 100.

14. The manufacturing method of the pressure sensor of claim 11, wherein the one-directional material comprises a metal nanowire, a carbon nanotube, or a metal oxide semiconductor, and the two-directional material comprises graphene oxide or molybdenum disulfide.

15. The manufacturing method of the pressure sensor of claim 14, wherein a metal of the metal nanowire comprises gold, silver, or copper, and a metal oxide of the metal oxide semiconductor comprises zinc oxide, titanium oxide, tungsten oxide, molybdenum oxide, vanadium oxide, copper oxide, nickel oxide, cobalt oxide, iron oxide, or tin oxide.

* * * * *